(12) United States Patent
Brown et al.

(10) Patent No.: US 10,409,384 B2
(45) Date of Patent: *Sep. 10, 2019

(54) SWITCH ACTUATING DEVICE, MOBILE DEVICE, AND METHOD FOR ACTUATING A SWITCH BY A NON-TACTILE GESTURE

(71) Applicant: PYREOS LTD., Edinburgh (GB)

(72) Inventors: Spyros Brown, Edinburgh (GB); Timothy John Chamberlain, Edinburgh (GB); Jonathan Ephraim David Hurwitz, Edinburgh (GB); Carsten Giebeler, Edinburgh (GB)

(73) Assignee: Pyreos Ltd., Edinburgh (GB)

( * ) Notice: Subject to any disclaimer, the term of this patent is extended or adjusted under 35 U.S.C. 154(b) by 161 days.

This patent is subject to a terminal disclaimer.

(21) Appl. No.: 15/607,404

(22) Filed: May 26, 2017

(65) Prior Publication Data

US 2017/0264292 A1   Sep. 14, 2017

Related U.S. Application Data

(63) Continuation of application No. PCT/EP2015/077666, filed on Nov. 25, 2015.

(30) Foreign Application Priority Data

Nov. 27, 2014  (DE) .................. 10 2014 017 585

(51) Int. Cl.
*G06F 3/01* (2006.01)
*H03K 17/945* (2006.01)
(Continued)

(52) U.S. Cl.
CPC ............ *G06F 3/017* (2013.01); *H03K 17/945* (2013.01); *G06F 1/3231* (2013.01); *G06F 3/01* (2013.01); *H03K 17/14* (2013.01); *H03K 17/962* (2013.01)

(58) Field of Classification Search
CPC ............... G06F 3/017; G06F 1/3231; G06F 3/041–048; H03K 17/945;
(Continued)

(56) References Cited

U.S. PATENT DOCUMENTS 4,914,298 A    4/1990   Quad et al.
8,546,210 B2 * 10/2013  Yamamoto ........ H01L 21/02532
                                             257/4
(Continued)

FOREIGN PATENT DOCUMENTS

DE       8705296 U1    4/1988
DE    102013200457 A1  7/2014
JP       2008232715 A  10/2008

OTHER PUBLICATIONS

Heng-Tze Cheng et al., "Contactless gesture recognition system using proximity sensors," 2011 IEEE International Conference on Consumer Electronics (ICCE), Jan. 9, 2011, pp. 149-150.
(Continued)

*Primary Examiner* — Sanjiv D. Patel
(74) *Attorney, Agent, or Firm* — Ewers & Hasselmann PLLC

(57) ABSTRACT

A switch actuating device for actuating a switch by eight types of non-tactile gestures performed with an object emitting heat includes a gesture sensor with four pixels configured to detect heat emitted by the object. The pixels include thin films made of pyroelectric sensitive material which generate a signal that has signal deflections corresponding to a temporal intensity curve of the heat detected by the thin film of the corresponding pixel. The types of the gestures are determined with a signal processing unit which controls an actuator to actuate the switch when a performance of one of the types of the gestures is determined. The gesture types are determined during an approach phase when the object approaches the gesture sensor, a waiting phase
(Continued)

during when the object remains close to the gesture sensor, and a subsequent translational phase when the object moves in one of eight directions.

20 Claims, 3 Drawing Sheets

(51) Int. Cl.
  *G06F 1/3231* (2019.01)
  *H03K 17/14* (2006.01)
  *H03K 17/96* (2006.01)
(58) Field of Classification Search
  CPC ............... H03K 17/6874; B60K 37/06; B60K 2350/1024; B60K 2350/104
  See application file for complete search history.

(56) References Cited

U.S. PATENT DOCUMENTS

| | | | |
|---|---|---|---|
| 10,001,840 B2* | 6/2018 | Giebeler | G06F 3/017 |
| 10,007,353 B2* | 6/2018 | Giebeler | G06F 3/017 |
| 10,023,427 B2* | 7/2018 | Scoville | G06F 3/017 |
| 2010/0204953 A1* | 8/2010 | Onishi | G06F 3/0304 702/150 |
| 2010/0295773 A1 | 11/2010 | Alameh et al. | |
| 2011/0050643 A1* | 3/2011 | Zhao | G06F 3/03547 345/175 |
| 2012/0030637 A1* | 2/2012 | Dey | G06F 3/017 715/863 |
| 2012/0139907 A1* | 6/2012 | Lee | G06F 3/0304 345/419 |
| 2015/0022316 A1* | 1/2015 | Dixon | G08B 25/001 340/5.51 |
| 2015/0301615 A1* | 10/2015 | Kasar | G06F 3/017 345/156 |

OTHER PUBLICATIONS

Piotr Wojtczuk et al., "Recognition of Simple Gestures Using a PIR Sensor Array," Sensors & Transducers Journal, vol. 14-1, Mar. 12, 2012, pp. 83-94.

International Search Report dated Feb. 23, 2016 of international application PCT/EP2015/077666 on which this application is based.

* cited by examiner

SWITCH ACTUATING DEVICE, MOBILE DEVICE, AND METHOD FOR ACTUATING A SWITCH BY A NON-TACTILE GESTURE

CROSS REFERENCE TO RELATED APPLICATIONS

This application is a continuation application of international patent application PCT/EP2015/077666, filed Nov. 25, 2015, designating the United States and claiming priority from German application 10 2014 017 585.5, filed Nov. 27, 2014, and the entire content of both applications is incorporated herein by reference.

TECHNICAL FIELD

The invention relates to a switch actuating device, a mobile device with the switch actuating device, and a method for operating a switch with the switch actuating device by a non-tactile gesture, in particular by a non-tactile gesture of a human hand.

BACKGROUND

Interactive systems and its human machine interfaces are known for human-computer interactions, wherein the human machine interfaces are provided with a device for the automatic recognition of a non-tactile or tactile gesture performed by human beings. The gesture can principally be derived from every posture and every movement of the body, wherein hand gestures have most importance. The gesture recognition device is provided with a device for the optical acquisition, in particular of a gesticulating hand, wherein the image information generated thereby is processed with corresponding algorithms in order to derive a gesture out of the image information. The device for the optical acquisition of a non-tactile gesture is conventionally a camera that disadvantageously takes a large space and involves high investment costs. Camera-based devices for the gesture recognition in miniaturized design with low costs, which would be for example advantageous for the use in mobile phones, are therefore not realized. Furthermore, camera-based devices have disadvantageously a high-energy consumption, and therefore, it is difficult to realize mobile applications. High-speed spectrometers are alternatively known, which cannot provide remedy with respect to the miniaturized design with low costs. Touch screens, in particular for mobile phones, are generally known. However, the touch screens are suitable only for the recognition of tactile gestures and not for the recognition of non-tactile gestures.

SUMMARY

It is an object of the invention to provide a switch actuating device, a mobile device equipped with the switch actuating device, and a method for operating a switch with the switch actuating device with a non-tactile gesture, wherein the switch actuating device has a miniaturized design with low costs and low energy consumption and the operation of the switch with the switch operating device is secure and has few errors.

According to an aspect of the invention, the switch actuating device for actuating a switch by eight possible types of non-tactile gestures, that are performed with an object emitting heat, includes a gesture sensor with four pixels configured to detect the heat emitted by the object when the object performs one of the eight types of the gestures and to output a signal per pixel. Each of the four pixels includes a respective thin film of pyroelectric sensitive material. The signal includes signal deflections corresponding to a temporal intensity curve of the heat detected by the thin film of the corresponding pixel. The switch actuating device includes a signal processing unit with which the performance of one of the types of the gesture can be determined from the temporal succession of the signal deflections, and an actuator that is controlled by the signal processing unit and that actuates the switch as soon as the performance of one of the types of the gestures is determined. The type of the gesture is defined during an approach phase in which the object approaches the gesture sensor, a subsequent waiting phase during which the object remains close to the gesture sensor, and a subsequent translational phase during which the object moves in one of eight directions. Four of the directions are longitudinal directions, a direction opposite to the longitudinal direction, a transverse direction which is at a right angle to the longitudinal direction, a direction opposite to the transverse direction and the four other directions are respectively rotated by 45° to one of the corresponding directions. The four pixels are respectively arranged in the corners of a convex tetragon. One of the diagonals thereof is substantially parallel to the longitudinal direction and the other diagonal thereof is substantially parallel to the transverse direction.

The mobile device according to an aspect of the invention includes the switch actuating device. The switch is interconnected with the mobile device for activation and/or deactivation of a functionality of the mobile device.

According to an aspect of the invention, a method for operating the switch actuating device includes the steps of outputting signal deflections from the pixels to the signal processing unit that are generated during an approach phase and signal deflections that are generated during a translational phase when the non-tactile gesture is performed with an object emitting heat. A waiting level of the signal is reached between the signal deflections during a waiting phase, wherein the waiting level has a lower absolute value than the absolute values of extreme values of the signal deflection. The method further includes the steps of monitoring the signals and identifying the occurrence of a succession of the signal deflections and the waiting level, which is arranged temporally between the signal deflections of the signal; as soon as the succession has been identified, the method proceeds to the next step in which it is determining if the signal deflections generated during the approach phase have a direction opposite to a direction of the signal deflections generated during the translational phase. If the determination is positive, the method proceeds to the next step. If it is determined that the time offset of the signal deflections generated during the approach phase is within a first predetermined period of time, the method proceeds to the next step. The method further includes determining if the time offset of the first temporal signal deflection and the last temporal signal deflection generated during the translational phase is within two threshold values and the lower of the two threshold values is greater than zero. If the determination is positive, the method proceeds to the next step. One of the eight types of the non-tactile gestures is determined based on the temporal succession of the signal deflections generated during the translational phase and the actuator is controlled to actuate the switch by the signal processor in accordance with an identified type of the non-tactile gestures.

Because the pixels respectively include the thin films made of the pyroelectric sensitive material, in particular made of lead-zirconate-titanate, the signals generated by the object emitting the heat when performing the non-tactile gestures are advantageously obtained such that the recognition of the type of the performed gesture can be carried out secure and has few errors. Furthermore, the gesture sensor with the pixels can be made in a miniaturized design with low costs such that the switch actuating device can be used in a mobile device. The signal is generated by the thin films from the heat emitted by the object so that the gesture sensor does not need to be supplied with energy from an external energy source. The switch actuating device therefore includes the signal processing unit and the actuator as energy consumers and the energy consumption of the switch actuating device for the mobile device is all together advantageously low.

For example, the first type of gesture may cause the execution of an ENTER-command and the second type of gesture may cause the execution of an ESCAPE-command.

According to an aspect of the invention, the tetragon is a rhombus. The distance of two immediately adjacent pixels is in a range of from 50 µm to 300 µm. According to another aspect of the invention, the object is a human hand and the heat emitted from the object is the body heat radiated by the human hand. The recognition of the type of the non-tactile gesture performed with the human hand with the switch actuating device is particularly secure and has few errors within the scope of usual human motion sequences.

According to an aspect of the invention, a first predetermined timespan has a maximum length of 40 ms. The degree of simultaneity of the occurrence of the signal deflections generated during the approach phase for the secure and error-free gesture recognition is thereby advantageously determined. According to an aspect of the invention, the lower threshold value is 10 ms and the upper threshold value is 100 ms. The temporal backslash of the last signal deflection generated during the translational phase to the first signal deflection generated in the translational phase is thereby advantageously determined for a secure and error-free gesture recognition.

The method preferably includes the steps of determining if the temporal delay of the signal deflections generated in the translational phase which are temporal between the first and the temporal last signal deflection generated during the translational phase is within a second predetermined timespan, in particular the second predetermined time span is 0.5 ms, whereby the direction of the performed gesture during the translational phase becomes identifiable as one of the four directions. If the determination is positive, the method proceeds to the next step. Alternatively, the method includes the step of determining if the temporal delay of the temporal first two signal deflections and the last two signal deflections generated in the translational phase is within a second predetermined timespan, in particular the second predetermined timespan is 0.5 ms, whereby the direction of the performed gesture during the translational phase becomes identifiable as one of the four other directions; if the determination is positive, the method proceeds to the next step.

According to another aspect of the invention, the method includes the step of determining if the duration of the waiting phase is within two waiting threshold values, wherein the lower of the two waiting threshold values is greater than zero; if the determination is positive, the method proceeds to the next step. According to yet another aspect of the invention, the lower waiting threshold value is 100 ms and the upper waiting threshold value is 1500 ms. The duration of the waiting phase is thereby advantageously defined for a secure and error-free gesture recognition.

According to an aspect of the invention, the method includes the step of determining if an absolute value of a first derivative with respect to time of the steepest inflection point of the signal deflections generated during the translational phase is greater than the absolute value of the first derivative with respect to time of the steepest inflection point of the signal deflections generated during the approach phase; if this is the case, the method proceeds to the next step. It is thereby possible to distinguish between the approach phase and the translational phase in a particularly secure and error-free manner.

According to a further aspect of the invention, the method includes the step of determining if the absolute values of the extreme values of the signal deflections are greater than a predetermined threshold value; if this is the case, the method proceeds to the next step. As a result, interference signals, which are generated by the pixels as a result of influences from the surroundings of the pixels, do not impair the gesture evaluation, whereby the accuracy of the gesture recognition is increased.

According to yet another aspect of the invention, the method includes the step of determining if the absolute values of the waiting level are at most 20% of at least one of the extreme values. If this is the case, the method proceeds to the next step. According to a further aspect of the invention, the method includes the step of determining if the waiting level is substantially zero.

BRIEF DESCRIPTION OF THE DRAWINGS

The invention will now be described with reference to the drawings wherein.

DESCRIPTION OF EXEMPLARY EMBODIMENTS

Figure 1:
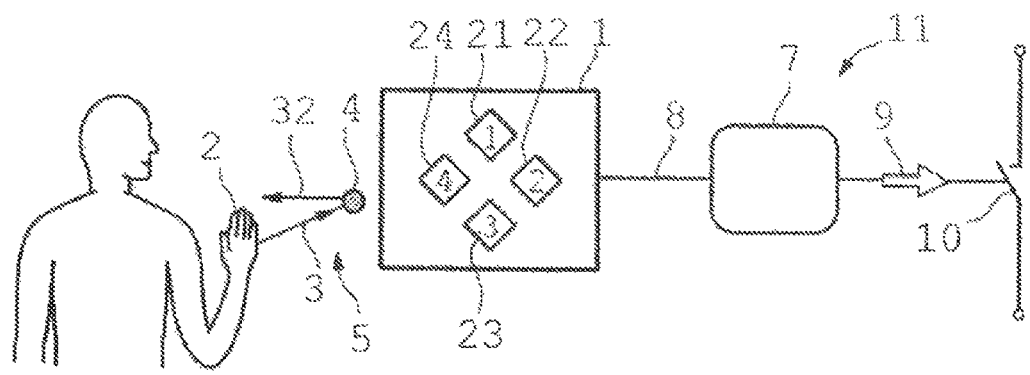
FIG. 1 shows a schematic illustration of a switch actuating device for a mobile device with a second type of gesture according to an exemplary embodiment of the invention.

In FIG. 1, a switch actuating device 11 is shown that is built in a mobile device. The switch operating device 11 includes a gesture sensor 1 and a signal processing unit 7 that is coupled via a signal line 8 with the gesture sensor 1 to transfer signals from the gesture sensor 1 to the signal processing unit 7. Depending on the results of the processing of the signals that are transferred from the gesture senor 1 to the signal processing unit 7, the signal processing unit 7 activates or deactivates an actuator 9, with which a switch 10 of the mobile device can be actuated. The switch 10 is interconnected with the mobile device for the activation and/or deactivation of a functionality of the mobile device.

The gesture sensor 1 is configured for detecting non-tactile gestures, wherein, depending on the gesture, the gesture sensor 1 detects a signal or a plurality of signals that are transferred to the signal processing unit 7 via the signal line 8 and based on which the actuation of the switch 10 can be accomplished via the actuator 9. The actuation of the switch 10 is only triggered when one of eight types of gestures 3, 4, 31 to 38 is identified by the gesture sensor 1 and the signal processing unit 7. The gestures are to be performed non-tactile with a hand 2 near the gesture sensor 1, wherein the heat emitted by the hand 2 is detected by the gesture sensor 1.

The eight types of gestures 3, 4, 31 to 38 are formed by an approach phase 3, in which the hand 2 approaches the gesture sensor 1, a waiting phase 4 following the approach phase 3, in which the hand 2 remains close to the gesture sensor 1, and a translational phase following the waiting phase 4, in which the hand 2 moves in one of eight directions. The eight types of gestures 3, 4, 31 to 38 are identical for the approach phase 3 and the waiting phase 4 and differ in the direction in which the hand 2 moves in the translational phase. FIG. 1 shows the second type of gesture 3, 4, 32. As it can be seen in FIG. 1, the gesture of the second type 3, 4, 32 is a movement of the hand 2 from right to left.

Figure 2:
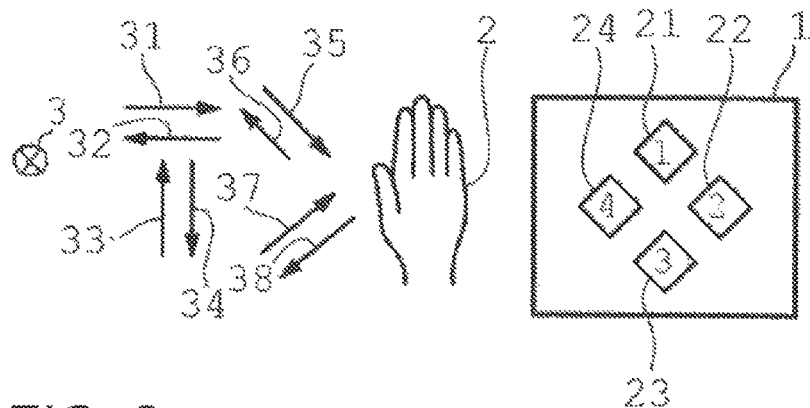
FIG. 2 shows a schematic illustration with eight types of gestures.

FIG. 2 shows all eight types of gestures 3, 4, 31 to 38. As it can be seen in FIG. 1, the first type of gesture 3, 4, 31 is in the translational phase a movement of the hand 2 from left to right, the second type of gesture 3, 4, 32 is in the translational phase a movement of the hand 2 from right to left. The third type of gesture 3, 4, 33 is in the translational phase a movement of the hand 2 from bottom to top, wherein the fourth type of gesture 3, 4, 34 is in the translational phase a movement of the hand 2 from top to bottom. Furthermore, the fifth type of gesture 3, 4, 35 is in the translational phase a movement of the hand 2 from upper left to lower right and the sixth type of gesture 3, 4, 36 is in the translational phase a movement of the hand 2 from lower right to upper left. Furthermore, the seventh type of gesture 3, 4, 37 is in the translational phase a movement of the hand 2 from lower left to upper right and the eighth type of gesture 3, 4, 38 is in the translational phase a movement of the hand 2 from upper right to lower left. It is, for example, conceivable that the switch actuating device 11 performs an ENTER-command with the first type of gesture 3, 4, 31, and the switch operating device 11 performs an ESCAPE-command with the second type of gesture 3, 3, 32.

Figure 3:
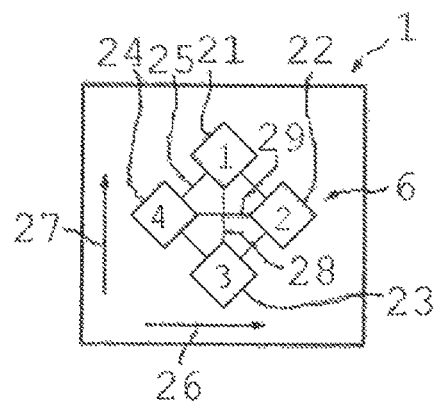
FIG. 3 shows a schematic illustration of a gesture sensor.

In FIG. 3, a schematic illustration of the gesture sensor 1 is shown. The gesture sensor 1 includes a rhombus 6 with a longitudinal diagonal 28 and a transversal diagonal 29, wherein a respective pixel 21 to 24 is arranged in each corner of the rhombus 6. As shown in FIG. 3, the first pixel 21 is arranged in the upper corner of the rhombus 6, the second pixel 22 is arranged in the right corner of the rhombus 6, the third pixel 23 is arranged in the lower corner of the rhombus 6 and the fourth pixel 24 is arranged in the left corner of the rhombus 6. The distance 25 of two immediately adjacent pixels is between 50 µm to 300 µm. A longitudinal direction 26 that is shown horizontally in FIG. 3 is parallel to the longitudinal diagonal 29 that is formed by the fourth pixel 24 and the second pixel 22. A transversal direction 27 as seen in FIG. 3 is parallel to the transversal diagonal 28 that is formed by the first pixel 21 and by the third pixel 23. The gestures of the first type 31 and of the second type 32 are in the translational phase parallel to the longitudinal direction 26, whereas the gestures of the third type 33 and the fourth type 34 are in the translational phase parallel to the transversal direction 27. The gestures of the first type 31 and of the second type 32 have opposite directions in the translational phase and the gestures of the third type 33 and of the fourth type 34 have opposite directions in the translational phase.

The pixels 21 to 24 are respectively made of a thin film of lead-zirconate-titanate, with which the signal is generated as soon as the respective pixel 21 to 24 detects a temporal change of the heat emitted by the hand 2. The signal with a signal deflection 48, 78 corresponding to the temporal intensity curve of the heat detected by the thin film of the corresponding pixel 21 to 24 is thus output from each pixel 21 to 24 to the signal processing unit 7 during performance of one of the gestures with the hand 2.

Figure 4:
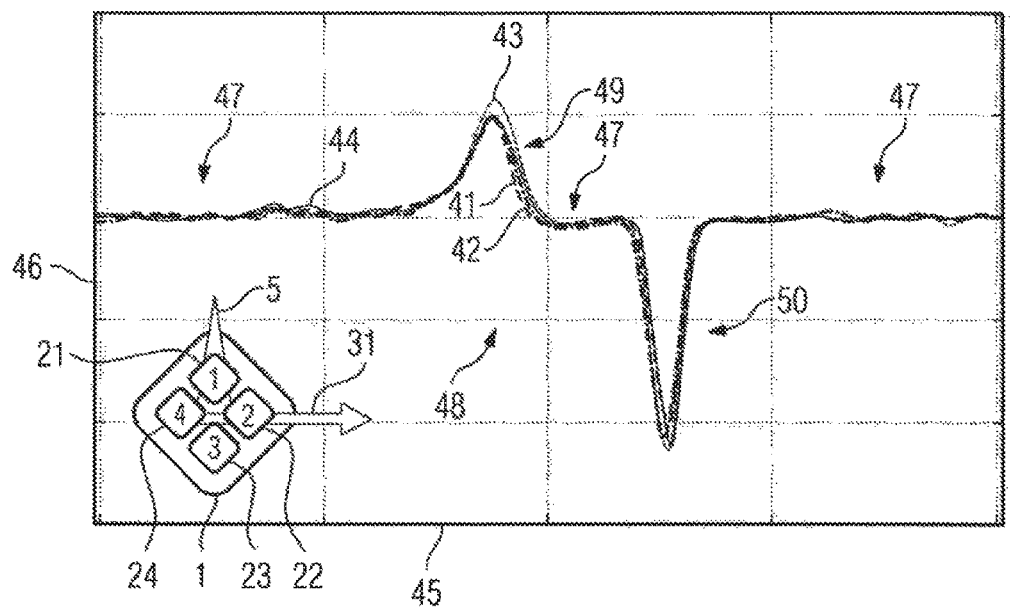
FIG. 4 shows a plot with signal curves of the gesture sensor from FIG. 3 for a first type of gesture.
Figure 5:
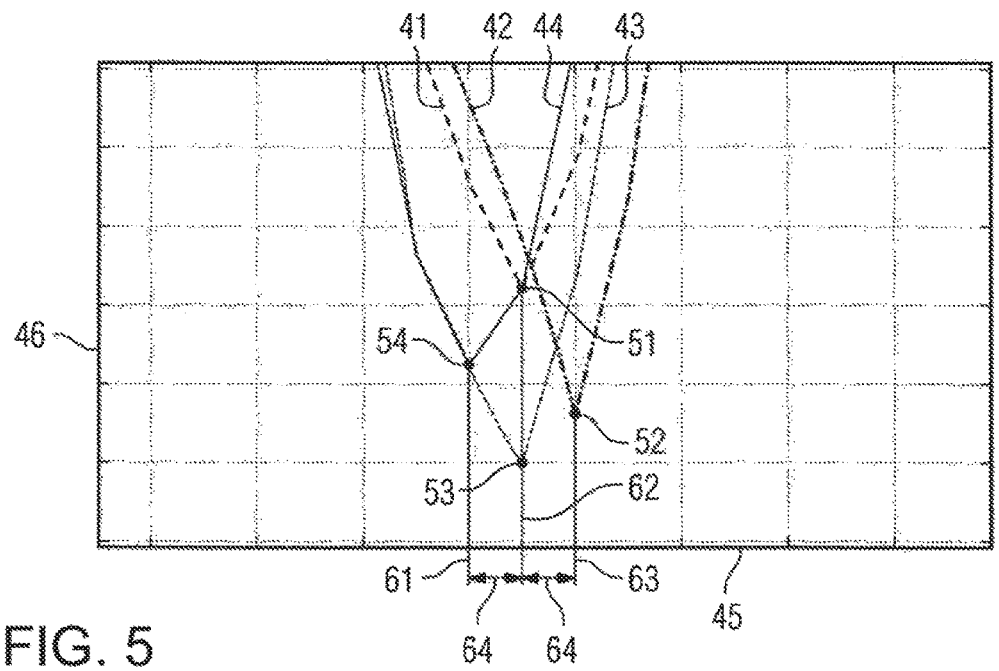
FIG. 5 shows a detailed view of FIG. 4.
Figure 6:
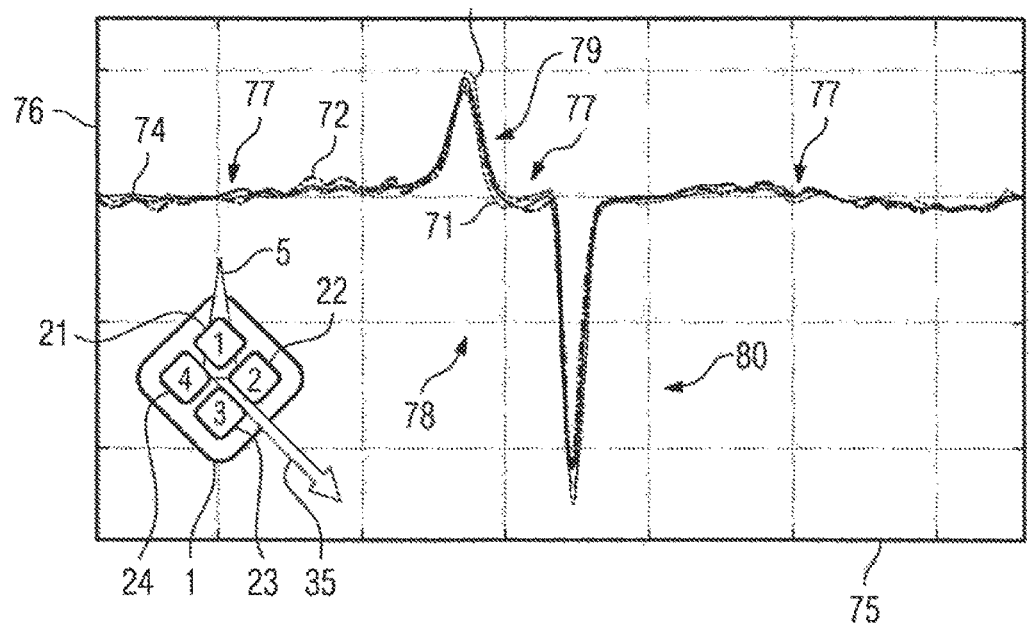
FIG. 6 shows a plot with signal curves of the gesture sensor of FIG. 3 for a fifth type of gesture.
Figure 7:
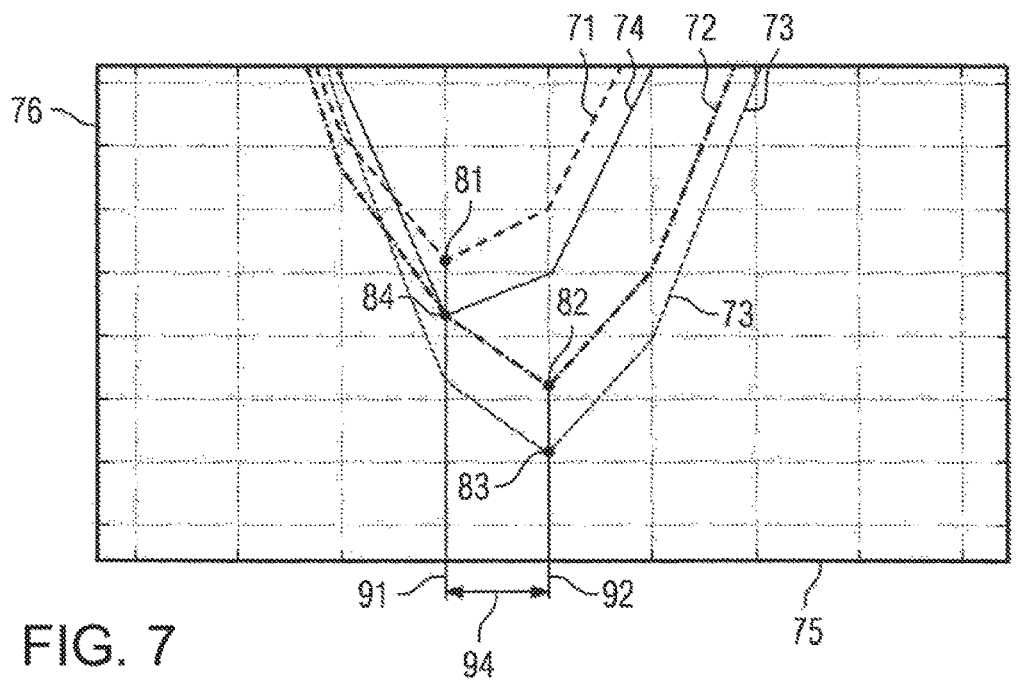
FIG. 7 shows a detailed view of FIG. 6.

FIGS. 4 and 5 show the signal deflections 48 during the first type of gesture 3, 4, 31 and FIGS. 6 and 7 show the signal deflections 78 during the fifth type of gesture 3, 4, 35. In FIGS. 4 and 5, the signal of the first pixel 21 is denoted with the reference sign 41, the signal of the second pixel 22 is denoted with the reference sign 42, the signal of the third pixel 23 is denoted with the reference sign 43, and the signal of the fourth pixel 24 is denoted with the reference sign 44. In FIGS. 6 and 7, the signal of the first pixel 21 is denoted with the reference sign 81, the signal of the second pixel 22 is denoted with the reference sign 82, the signal of the third pixel 23 is denoted with the reference sign 83 and the signal of the fourth pixel 24 is denoted with the reference sign 84. FIGS. 4 and 5 show a plot with the temporal signal curves of the signals 41 to 44 output by the pixels 21 to 24, wherein the time is plotted over the abscissa 45 and the signal is plotted over the ordinate 46. FIGS. 6 and 7 show a plot with the temporal signal curve of the signals 81 to 84 output by the pixels 21 to 24, wherein the time is plotted over the abscissa 75 and the signal is plotted over the ordinate 76. For all plots the signal is an electrical voltage.

As it can be seen from the FIGS. 4 and 6, the signal deflections 48, 78 include respective signal deflections 49, 79 generated during the approach phase, and respective signal deflections 50, 80 generated during the translational phase which is temporally after the signal deflection 49, 79 generated during the approach phase. The signal deflections 49, 79 generated during the approach phase have thereby an opposite sign to the signal deflections 50, 80 generated during the translational phase. In FIGS. 4 and 6, the signal deflections 49, 79 generated during the approach phase include a maximum and the signal deflection 50, 80 generated during the translational phase include a minimum. A waiting level 47, 77 corresponding to the waiting phase 4 is respectively arranged between the signal deflections 49, 79 generated during the approach phase and the signal deflections 50, 80 generated during the translational phase.

FIG. 5 shows a magnification of the minimum generated in the translational phase from FIG. 4, and FIG. 7 shows a magnification of the minimum generated in the translational phase from FIG. 6. Each of the signal curves 41 to 44 of FIGS. 4 and 5 includes a respective minimum 51 to 54 and each of the signal curves 71 to 74 includes a respective minimum 81 to 84. FIG. 5 shows that during the first type of gesture 3, 4, 31, the minimum 54 of the signal curve 44 of the fourth pixel 24 is located at a first point in time 61, the minima 51, 53 of the signal curves 41, 43 of the first pixel 21 and the third pixel 23 are located at a second point in time 62 and the minimum 52 of the signal curve 42 of the second pixel 22 is located at a third point in time 63. The third point in time 63 is located temporally after the second point in time 62 that is located temporally after the first point in time 61, wherein the first temporal delay 64 from the second point in time 62 to the first point in time 61 and the first temporal delay 64 from the third point in time 63 to the second point in time 62 are identical. FIG. 7 shows that during the fifth type of gesture 3, 4, 35, the minima 81, 84 of the signal curves 71, 74 of the first pixel 21 and the fourth pixel 24 are located at a fourth point in time 91 and the minima 82, 83 of the signal curves 72, 73 of the second pixel 22 and the third pixel 23 are located at a fifth point in time 92, wherein the fifth point in time 92 is located temporally after the fourth point in time 91.

A method for identifying the first four types of gestures and for operating the switch operating device 11 is now described with reference to FIGS. 4 and 5. By performing the non-tactile gesture with the hand 2, the signal deflections 48 are put out by the pixels 21 to 24. The signals 41 to 44 are examined to the occurrence of the succession of the signal deflections 48 including the waiting level 47. It is then determined if the signal deflections 49 have an opposite direction to the signal deflections 50, and if the temporal delay of the signal deflections 49 is within 50 ms. Furthermore, it is also determined if the temporal delay of the temporal first 44 and of the temporal last 42 signal deflection 50 is between 10 ms and 100 ms. Furthermore, if the duration of the waiting phase 4 is within 100 ms and 1500 ms and if the temporal delay of the signal deflections 41, 43 is within 0.5 ms, the direction of the performed gesture during the translational phase is identifiable as one of the four directions. According to FIGS. 4 and 5, the performed gesture includes the direction from left to right so that the performed gesture is identified as the gesture of the first type 3, 4, 31. The actuator 9 is controlled accordingly by the signal processing unit 7 to operate the switch 10.

A method for identifying the last four types of gestures and for operating the switch actuating device 11 is now described with reference to FIGS. 6 and 7. By performing a non-tactile gesture with the hand 2, the signal deflections 78 are output by the pixels 21 to 24. The signals 71 to 74 are examined to the occurrence of the succession of the signal deflections 78 including the waiting level 77. It is then determined, if the signal deflections 79 have an opposite direction to the signal deflections 80 and if the second temporal delay 94 of the signal deflections 79 is within 50 ms. Furthermore, it is determined, if the second temporal delay 94 respectively of the temporal first two signal deflections 71, 74 and of the temporal last two signal deflections 72, 73 is within 0.5 ms. If furthermore the duration of the waiting phase 4 is within 100 ms and 1500 ms and if the second temporal delay 94 of the temporal first 71, 74 and the temporal last 72, 73 signal deflection 80 is between 10 ms and 100 ms, the direction of the performed gesture during the translational phase is identifiable as one of the four other directions. As shown in FIGS. 6 and 7, the performed gesture includes the direction from upper left to lower right so that the performed gesture becomes identifiable as the gesture of the fifth type 3, 4, 35. The actuator 9 is controlled accordingly by the signal processing unit 7 to actuate the switch 10.

Alternatively, it is possible for the definition and identification of the types of gestures that the duration of the waiting phase is zero, wherein the lower waiting threshold value and the upper waiting threshold value coincide and thus are at 0 ms.

Furthermore, it is determined in both methods, if the absolute value of the first derivative with respect to time of the steepest inflection point of the signal deflections 49, 79 is greater than the absolute value of the first derivative with respect to time of the steepest inflection point of the signal deflection 50, 80. It is also determined, if the absolute values of the extreme values of the signal deflections 49, 50, 70, 80 are greater than a predetermined threshold value with which interference signals of the pixel 21 to 24 are suppressed. Furthermore, it is determined, if the absolute value of the waiting level 47, 77 is at most 20% of at least one of the absolute values of the extreme values and is substantially zero.

It is understood that the foregoing description is that of the exemplary embodiments of the invention and that various changes and modifications may be made thereto without departing from the spirit and scope of the invention as defined in the appended claims.

LIST OF REFERENCE NUMERALS 1 gesture sensor
2 hand
3 approach phase
4 waiting phase
5 push-gesture
6 rhombus
7 signal processing unit
8 signal line
9 actuator
10 switch
11 switch actuating device
21 first pixel
22 second pixel
23 third pixel
24 fourth pixel
25 distance of two adjacent pixels
26 longitudinal direction
27 transverse direction
28 longitudinal diagonal
29 transverse diagonal
31 translational gesture first type
32 translational gesture second type
33 translational gesture third type
34 translational gesture fourth type
35 translational gesture fifth type
36 translational gesture sixth type
37 translational gesture seventh type
38 translational gesture eight type
41 signal of the first pixel
42 signal of the second pixel
43 signal of the third pixel
44 signal of the fourth pixel
45 abscissa
46 ordinate
47 waiting level
48 signal deflection
49 signal deflection generated during the approach phase
50 signal deflection generated during the translational phase
51 first minimum
52 second minimum
53 third minimum
54 fourth minimum
61 first point in time
62 second point in time
63 third point in time
64 first temporal delay
71 signal of the first pixel
72 signal of the second pixel
73 signal of the third pixel
74 signal of the fourth pixel
75 abscissa
76 ordinate
77 signal level during pixel passivity
78 signal deflection
79 first part of the signal deflection during approaching 80 second part of the signal deflection during translational gesture 31
81 first minimum
82 second minimum
83 third minimum
84 fourth minimum
85 translational gesture fifth type
91 fourth point in time
92 fifth point in time
94 second temporary delay

What is claimed is:

1. A switch actuating device for actuating a switch in response to eight types of non-tactile gestures performed with an object emitting heat, the switch operating device comprising:
 a gesture sensor having four pixels, each of the four pixels including a thin film being made of a pyroelectric sensitive material, and the four pixels being arranged in respective corners of a convex tetragon relative to one another such that the eight types of the non-tactile gestures are detectable;
 the gesture sensor being configured to:
 detect, by each of the thin films of the four pixels, heat emitted by the object when the object performs any one of the eight types of the non-tactile gestures, and
 to output a signal per pixel, the signals having signal deflections corresponding to a temporal intensity curve of the heat detected by the thin films of the corresponding pixels;
 a signal processing unit configured to determine performance of any one of the eight types of the non-tactile gestures based on a temporal succession of the signal deflections resulting from temporal delays of the signal deflections relative to one another;
 an actuator controlled by the signal processing unit and configured to actuate the switch when the performance of one of the eight types of the non-tactile gestures is determined;
 the eight types of the non-tactile gestures being defined by an approach phase during which the object approaches the gesture sensor, a subsequent waiting phase during which the object remains close to the gesture sensor, and a subsequent translational phase during which the object moves in one of eight directions;
 first four of the eight directions being a longitudinal direction, a direction opposite to the longitudinal direction, a transverse direction at right angle to the longitudinal direction, and a direction opposite to the transverse direction;
 second four directions of the eight directions being directions respectively rotated by 45° relative to corresponding ones of the first four of the eight directions; and
 one diagonal of the convex tetragon being substantially parallel to the longitudinal direction and another diagonal of the convex tetragon being substantially parallel to the transverse direction.

2. The switch actuating device of claim 1, wherein the pyroelectric sensitive material is lead-zirconate-titanate.

3. The switch actuating device of claim 1, wherein the convex tetragon is a rhombus.

4. The switch actuating device of claim 1, wherein a distance between two immediately adjacent pixels of the four pixels is in a range of from 50 µm to 300 µm.

5. The switch actuating device of claim 1, wherein:
 the object is a human hand, and
 the heat emitted from the object is body heat radiated by the human hand.

6. A mobile device comprising:
 the switch actuating device of claim 1,
 wherein the switch is interconnected with the mobile device and configured to activate, deactivate, or activate and deactivate a functionality of the mobile device.

7. A method for operating a switch actuating device, the switch actuating device including a gesture sensor having four pixels, each of the four pixels including a thin film being made of a pyroelectric sensitive material, and the four pixels being arranged in respective corners of a convex tetragon relative to one another such that eight types of non-tactile gestures are detectable, the gesture sensor being configured to detect, by each of the thin films of the four pixels, heat emitted by an object when the object performs any one of eight types of non-tactile gestures, and to output a signal per pixel, the signals having signal deflections corresponding to a temporal intensity curve of the heat detected by the thin films of the corresponding pixels, a signal processing unit configured to determine performance of any one of the eight types of the non-tactile gestures based on a temporal succession of the signal deflections resulting from temporal delays of the signal deflections relative to one another, an actuator controlled by the signal processing unit and configured to actuate a switch when the performance of one of the eight types of the non-tactile gestures is determined, the eight types of the non-tactile gestures being defined by an approach phase during which the object approaches the gesture sensor, a subsequent waiting phase during which the object remains close to the gesture sensor, and a subsequent translational phase during which the object moves in one of eight directions, first four of the eight directions being a longitudinal direction, a direction opposite to the longitudinal direction, a transverse direction at a right angle to the longitudinal direction, and a direction opposite to the transverse direction, second four directions of the eight directions being directions respectively rotated by 45° relative to corresponding ones of the first four of the eight directions; and one diagonal of the convex tetragon being substantially parallel to the longitudinal direction and another diagonal of the convex tetragon being substantially parallel to the transverse direction, the method comprising the steps of:
 (a) outputting signal deflections generated during the approach phase and signal deflections generated during the translational phase from the four pixels to the signal processing unit when the non-tactile gesture are performed with the object emitting heat, a waiting level of the signal being reached between the signal deflections during the subsequent waiting phase, the waiting level having a first absolute value, extreme values of the signal deflections having second absolute values, and the first absolute value being lower than the second absolute values;
 (b) monitoring the signal and identifying an occurrence of a succession of the signal deflections and the waiting level which is arranged temporally between the signal deflections of the signal, and when the succession has been identified, proceeding to step (c);
 (c) determining if the signal deflections generated during the approach phase have directions opposite to directions of the signal deflections generated during the translational phase, and if the signal deflections generated during the approach phase have directions opposite to directions of the signal deflections generated during the translational phase, proceeding to step (d);

(d) determining if a time offset of the signal deflections generated during the approach phase is within a first predetermined period of time, and if the time offset of the signal deflections generated during the approach phase is within the first predetermined period of time, proceeding to step (e);

(e) determining if a time offset of a first temporal signal deflection and a last temporal signal deflection generated during the translational phase is within two threshold values and a lower threshold value of the two threshold values is greater than zero; and if the time offset of the first temporal signal deflection and the last temporal signal deflection generated during the translational phase is within the two threshold values and the lower threshold value of the two threshold values is greater than zero, proceeding to step (f);

(f) identifying one of the eight types of the non-tactile gestures based on the temporal succession of the signal deflections generated during the translational phase; and (g) controlling the actuator to actuate the switch by the signal processor in accordance with the identified one of the eight types of the non-tactile gestures.

8. The method of claim 7, wherein a first predetermined timespan has a maximum length of 40 ms.

9. The method of claim 7, wherein the lower threshold value is 10 ms and an upper threshold value of the two threshold values is 100 ms.

10. The method of claim 7, further comprising the step of:
(h) determining if a temporal delay of signal deflections generated during the translational phase between the first temporal signal deflection and the last temporal signal deflection generated during the translational phase is within a second predetermined timespan to identify a direction of a performed gesture during the translational phase as one of the four directions.

11. The method of claim 10, wherein the second predetermined timespan is 0.5 ms.

12. The method of claim 7, further comprising the step of:
(i) determining if a temporal delay of two first temporal signal deflections and two last temporal signal deflections generated during the translational phase is within a second predetermined timespan to identify a direction of a performed gesture during the translational phase as one of the four other directions.

13. The method of claim 12, wherein the second predetermined timespan is 0.5 ms.

14. The method of claim 7, further comprising the step of:
(j) determining if a duration of the subsequent waiting phase is within two waiting threshold values, wherein a lower waiting threshold value of the two waiting threshold values is greater than zero.

15. The method of claim 14, wherein the lower waiting threshold value is 100 ms and an upper waiting threshold value of the two waiting threshold values is 1500 ms.

16. The method of claim 7, further comprising the step of:
(k) determining if an absolute value of a first derivative with respect to a time of a steepest inflection point of the signal deflections generated during the translational phase is greater than an absolute value of the first derivative with respect to the time of the steepest inflection point of the signal deflections generated during the approach phase.

17. The method of claim 7, further comprising the step of:
(l) determining if the second absolute values of the extreme values of the signal deflections are greater than a predetermined threshold value.

18. The method of claim 7, further comprising the step of:
(m) determining if the first absolute values of the waiting level are at most 20% of at least one of the second absolute values of the extreme values.

19. The method to claim 7, further comprising the step of:
(n) determining if the waiting level is substantially zero.

20. The switch actuating device of claim 1, wherein rotations of the second four directions of the eight directions by 45° relative to the corresponding ones of the first four of the eight directions correspond to lines forming a periphery of the convex tetragon.

* * * * *